(12) United States Patent
Namaky

(10) Patent No.: US 6,911,825 B2
(45) Date of Patent: Jun. 28, 2005

(54) BATTERY TESTER WITH CCA LOOKUP TABLE

(75) Inventor: Hamid Namaky, South Russell, OH (US)

(73) Assignee: SPX Corporation, Charlotte, NC (US)

( * ) Notice: Subject to any disclaimer, the term of this patent is extended or adjusted under 35 U.S.C. 154(b) by 37 days.

(21) Appl. No.: 10/431,017

(22) Filed: May 7, 2003

(65) Prior Publication Data

US 2004/0051533 A1 Mar. 18, 2004

Related U.S. Application Data

(60) Provisional application No. 60/411,619, filed on Sep. 18, 2002, and provisional application No. 60/411,557, filed on Sep. 18, 2002.

(51) Int. Cl.$^7$ ............................................. G01N 27/416
(52) U.S. Cl. ...................................................... 324/426
(58) Field of Search ................................ 324/426, 427, 324/428, 429, 430, 433; 320/132, DIG. 21

(56) References Cited

U.S. PATENT DOCUMENTS

| | | | |
|---|---|---|---|
| 4,423,378 A | 12/1983 | Marino et al. | |
| 4,433,294 A | 2/1984 | Windebank | |
| 4,967,143 A | 10/1990 | Raviglione et al. | |
| 5,485,090 A | 1/1996 | Stephens | |
| 5,491,418 A | 2/1996 | Alfaro et al. | |
| 5,821,756 A | 10/1998 | McShane et al. | |
| 5,831,435 A | 11/1998 | Troy | |
| 5,875,413 A | 2/1999 | Vinci | |
| 6,091,245 A | 7/2000 | Bertness | |
| 6,104,167 A | 8/2000 | Bertness et al. | |
| 6,307,379 B2 | 10/2001 | Podrazhansky et al. | |
| 6,363,303 B1 | 3/2002 | Bertness | |
| 6,445,158 B1 * | 9/2002 | Bertness et al. ............ | 320/104 |
| 6,586,941 B2 * | 7/2003 | Bertness et al. ............ | 324/426 |
| 6,759,849 B2 * | 7/2004 | Bertness et al. ............ | 324/426 |
| 2001/0002552 A1 | 6/2001 | Vinci | |
| 2002/0008523 A1 | 1/2002 | Klang | |

* cited by examiner

*Primary Examiner*—Edward H. Tso
(74) *Attorney, Agent, or Firm*—Baker & Hostetler LLP

(57) ABSTRACT

The present invention is directed toward a handheld battery tester that automatically determines and displays to the user a nominal battery rating (e.g., CCA rating) in response to the user entering certain vehicle information, e.g., the make and model of the vehicle. This eliminates the need to read the battery CCA rating from the battery and eliminates the need to check a secondary reference to be sure that the battery in the vehicle is rated high enough for that vehicle. Preferably, the battery tester is a processor-based battery tester that automatically uses the determined nominal CCA rating rather than making the user enter the displayed value.

32 Claims, 4 Drawing Sheets

BATTERY TESTER WITH CCA LOOKUP TABLE

CROSS-REFERENCE TO RELATED APPLICATIONS

This application claims priority to U.S. Provisional Application No. 60/411,619 filed on Sep. 18, 2002, and Ser. No. 60/411,557, field Sep. 18, 2002, which is hereby incorporated by reference in its entirety.

FIELD OF THE INVENTION

The present invention pertains generally to electrical testing equipment and, more particularly, to electronic testing of electrical storage devices, such as batteries.

BACKGROUND OF THE INVENTION

Many batteries are rated by a measure of CCA (Cold Cranking Amps) according to an industry standard test procedure. The procedure begins with a fully charged battery. Then, a very large current load is drawn from the battery for a specified time. The test current is based on the presumed CCA rating of the battery. Afterwards, the battery voltage is measured. If the voltage is at (or above) a specified value, the battery is said to have at least the presumed CCA rating.

Battery testers typically determine the condition of batteries, i.e., determine the internal resistance of a battery, by either a load test or a small-signal analysis of the battery. For a classic load test, a very high-current load is applied to the battery for a specified time and battery voltage is measured thereafter. Dougherty U.S. Pat. No. 5,773,977 teaches a tester that uses a bounce-back voltage after a load is removed to determine the condition of the battery. An example of a load tester is the well-known SUN VAT 40 load tester.

Small-signal battery testers determine the condition of a battery by imposing a relatively low current (e.g., on the order of about an amp) AC signal across the terminals of the battery and analyzing the small AC voltage generated as a result of the internal resistance of the battery, e.g., by comparing a value related to battery internal resistance or conductance or impedance or admittance to a threshold value that is a function of the rated CCA value of the battery. Examples of the literally hundreds of patents showing small-signal battery testers include the testers shown in Furuishi U.S. Pat. No. 3,753,094, Bosch DE 29 26 716 B1, Champlin U.S. Pat. Nos. 3,873,911, 3,909,708, 4,912,416, 5,572,136, and 5,585,728, Namaky U.S. Pat. No. 6,384,608 B1, and Cervas U.S. Pat. No. 6,388,488. The testers in Frailing U.S. Pat. No. 4,193,025, Marino U.S. Pat. No. 4,423,378, and Dougherty, et al. U.S. Pat. No. 6,144,185 are examples of testers that use both (i) one or more load tests and (ii) one or more small signal tests to determine battery condition. All of the foregoing patents are incorporated herein by reference. Also incorporated herein by reference is copending U.S. patent application Ser. No. 09/813,104, which was filed on Mar. 19, 2001, and entitled HANDHELD TESTER FOR STARTING/CHARGING SYSTEMS. Various small signal battery testers have been sold by Actron Manufacturing Co., Robert Bosch GmbH, and others.

For virtually every battery tester, the user must enter the CCA rating (or some other rating of the battery) of the battery into the tester, e.g., with a knob or dial or via a processor-driven user interface. This requires the user to identify the Cold Cranking Amps ("CCA") rating for the battery, and enter that number into the tester. Determining the CCA rating for the battery can be difficult because the battery's information plate is often covered with dirt and grime to the extent that the CCA rating is illegible. In this situation, to determine the CCA rating, the user must clean off the battery nameplate, while being careful to avoid being shocked or burned. Sometimes it is very difficult to access the side of the battery that indicates the battery rating. Also, it is not uncommon for the battery name plate to be entirely missing. Moreover, even if the battery passes the battery test, the user often has no idea if that battery is the proper size for the vehicle in question and must, therefore, consult a secondary reference, such as the owners manual, to determine whether the battery CCA rating is equal to or higher than the required CCA rating for the particular vehicle.

SUMMARY OF THE INVENTION

The present invention is directed toward a handheld battery tester that automatically determines and displays to the user a nominal battery rating (e.g., CCA rating) in response to the user entering certain vehicle information, e.g., the make and model of the vehicle. This eliminates the need to read the battery CCA rating from the battery and eliminates the need to check a secondary reference to be sure that the battery in the vehicle is rated high enough for that vehicle. For ease of use, preferably, the battery tester is a processor-based battery tester that automatically uses the determined nominal CCA rating rather than making the user enter the displayed battery CCA rating.

In the preferred embodiment, prior to starting the battery test, the user selects the make and model of the vehicle from a pre-stored list in the tester. The pre-stored list can be updated periodically by a variety of methods well known in the art. The battery tester then determines and displays the proper CCA rating for the vehicle. A preferred embodiment, the battery tester is a processor-based tester and the CCA rating value is automatically entered into the battery testing routine. In the alternative, the battery tester is an analog battery tester and the user manually reads the displayed CCA rating and manually enters that value into the tester, e.g., by turning a potentiometer.

Additionally, another aspect of the present invention is to provide a battery tester that functions as an electronic battery unit standard converter, so that the user may enter a battery rating in one standard (e.g., CCA, CA, JIS, DIN, IEC, SAE, EN, etc.) and have the tester convert that entered battery rating to an equivalent rating in one or more of the different standards. One of the displayed equivalent ratings could then be manually entered into the tester prior to performing the battery test.

It is therefore an advantage of the present invention to provide a battery tester that automatically determines a battery rating corresponding to vehicle information entered by the user.

It is another advantage of the present invention to provide a battery tester that automatically determines a battery rating corresponding to vehicle information entered by the user and automatically uses that determined battery rating for a battery test.

It is still another advantage of the present invention to provide a battery tester that is an electronic battery rating converter.

It is yet another advantage of the present invention to provide an improved battery testing device that does not require the user to locate or clean off the battery nameplate and enter the battery CA or CCA rating.

It is also an advantage of the present invention to provided an improved battery testing device that eliminates the need to consult a secondary reference to determine whether a battery is correctly sized for the vehicle in which it is installed.

These and other advantages of the present invention will become more apparent from a detailed description of the invention.

BRIEF DESCRIPTION OF THE DRAWINGS

In the accompanying drawings, which are incorporated in and constitute a part of this specification, embodiments of the invention are illustrated, which, together with a general description of the invention given above, and the detailed description given below, serve to example the principles of this invention, wherein.

DETAILED DESCRIPTION OF THE DRAWINGS

Figure 1:
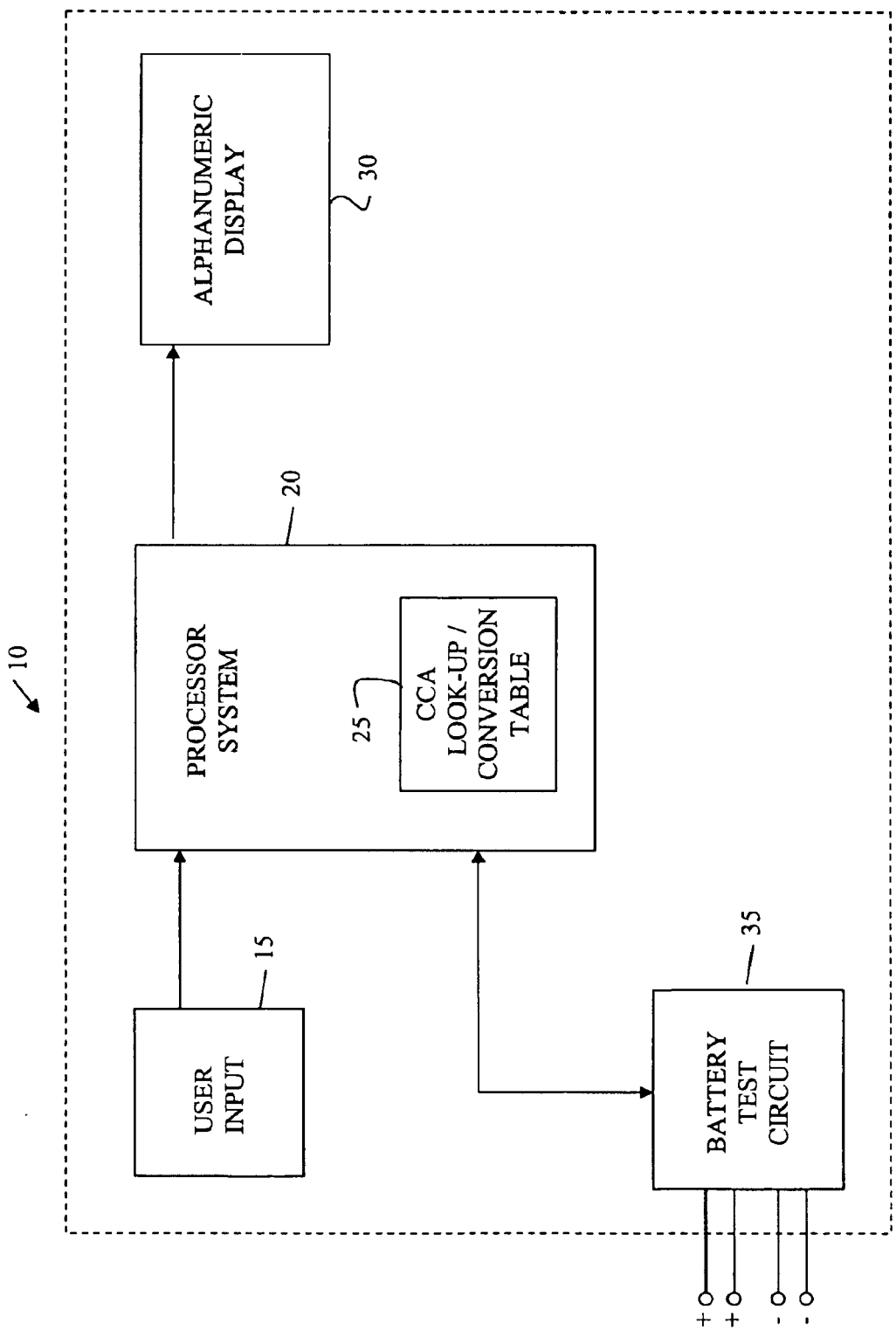
FIG. 1 is a high-level block diagram of a digital battery tester having a battery rating lookup table according to the present invention.
Figure 4:
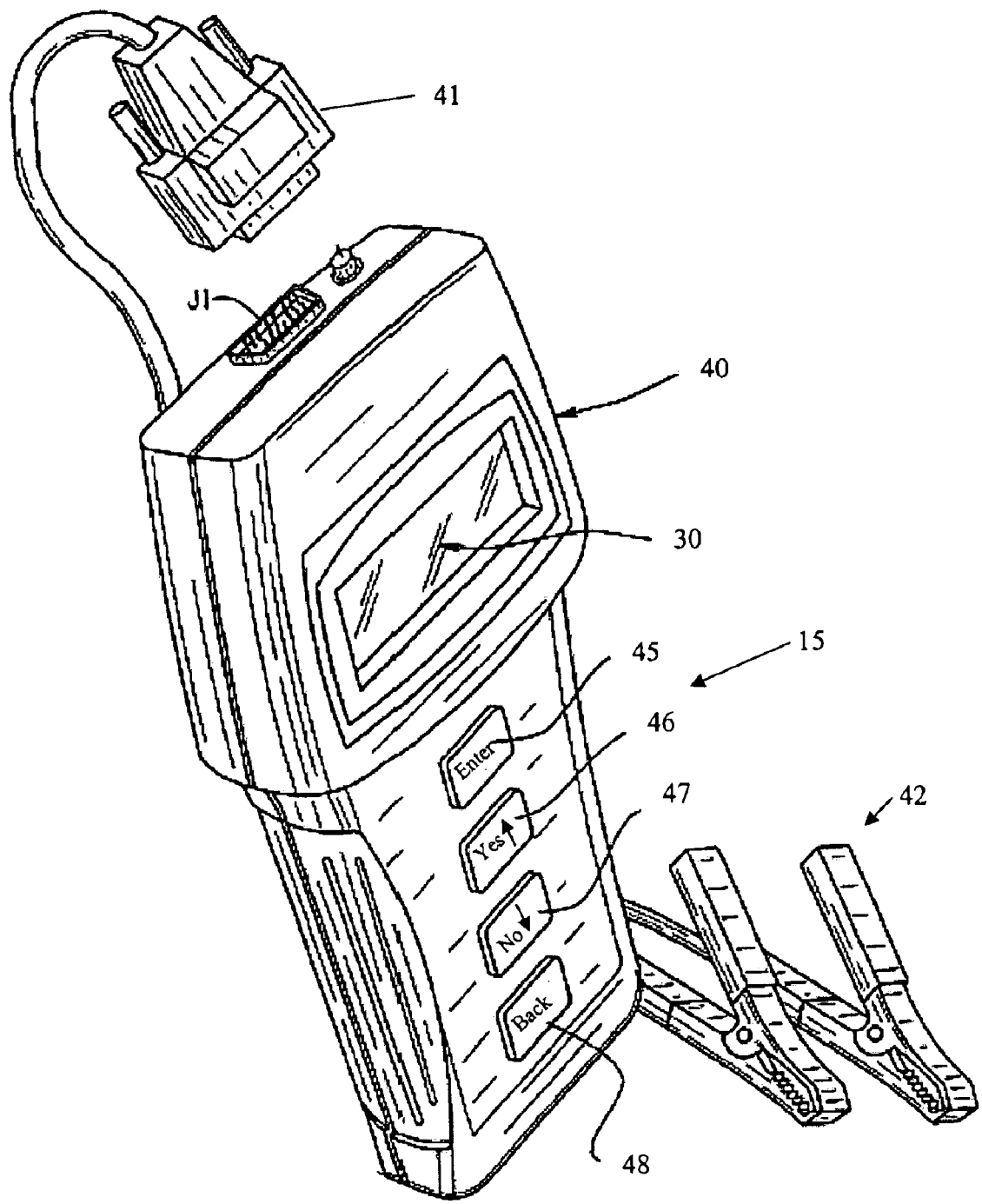
FIG. 4 is an isometric view of an exemplary embodiment of the handheld battery tester according to the present invention.

FIG. 1 illustrates a high-level block diagram of a digital (e.g., processor-based) tester 10 in accordance with the present invention, depicting a handheld battery tester 10 with a battery rating lookup table 25. Such a battery tester 10 preferably includes a user input 15, an alphanumeric display 30, a battery test circuit 35, all in circuit communication with a processor system 20. The user input 15, processor system 20, lookup table 25, alphanumeric display 30, and battery test circuit 35 are all preferably housed in a single hand-held enclosure 40 (FIG. 4).

"Circuit communication" as used herein indicates a communicative relationship between devices. Direct electrical, electromagnetic, and optical connections and indirect electrical, electromagnetic, and optical connections are examples of circuit communication. Two devices are in circuit communication if a signal from one is received by the other, regardless of whether the signal is modified by some other device. For example, two devices separated by one or more of the following—amplifiers, filters, transformers, optoisolators, digital or analog buffers, analog integrators, other electronic circuitry, fiber optic transceivers, or even satellites—are in circuit communication if a signal from one is communicated to the other, even though the signal is modified by the intermediate device(s). As another example, an electromagnetic sensor is in circuit communication with a signal if it receives electromagnetic radiation from the signal. As a final example, two devices not directly connected to each other, but both capable of interfacing with a third device, e.g., a CPU, are in circuit communication.

The input device(s) 15, typically includes one or more keys or a keyboard, but may be one or more of virtually any type of input device, such as touch screens, alphanumeric keypad etc., with which the user enters data to the processor 20.

The processor circuit 20, also referred to herein as just processor 20, may be one of virtually any number of processor systems and/or stand-alone processors, such as microprocessors, microcontrollers, and digital signal processors, and has associated therewith, either internally therein or externally in circuit communication therewith, associated RAM, ROM, EPROM, EEPROM, clocks, decoders, memory controllers, and/or interrupt controllers, etc. (all not shown) known to those in the art to be needed to implement a processor circuit. In addition, one or more optional removable additional storage devices (not shown) can be placed in circuit communication with the processor system 20 and can include, for example, cartridge memories (such as those containing EPROM, EEPROM, or Flash PROM memories), PC cards, stick memories (such as SONY brand MEMORY STICK packaged memory semiconductors), so-called floppy diskettes, etc. The processor 20 typically executes a computer program or code stored in its RAM, ROM, Flash memory, EEPROM, and/or EPROM (all not shown) and/or stored in any of the additional storage devices, if any, using data stored in any one or more of those memories. For example, the processor 20 might execute code from EEPROM instructing the processor to identify battery rating information for a vehicle from a lookup table stored in a removable SMARTMEDIA memory.

The processor system 20 preferably includes a pre-stored battery rating lookup table 25, which preferably has stored therein one battery rating for each vehicle identification set (set of parameters identifying a vehicle). Preferably, the battery rating includes a battery CCA rating and the vehicle identification set includes at least vehicle make and model (e.g., FORD/MUSTANG); for some vehicles the vehicle identification set includes at least the vehicle make, model, and year of vehicle (e.g., 1999/FORD/MUSTANG), and for some vehicles vehicle identification set includes at least the vehicle make, model, and year of vehicle, and the engine size (e.g., 2000/JEEP/GRAND CHEROKEE/8 cylinders).

The display 30, can be one or more of virtually any type of display, e.g., textual displays (such as n character by m line LCD or plasma displays, etc.), binary displays (such as LEDs, lamps, etc.), graphical displays (such as LCD displays that can display text and bar graphs and the like), etc.

The battery test circuit 35 includes a processor-based battery test circuit that is small enough to be housed in a hand-held enclosure. Virtually any hand-held processor-based battery test circuit could be suitable, including small-signal testers (resistance-based, conductance-based, impedance-based, and/or admittance-based), load testers, voltage bounce-back testers, and circuits that perform both load tests and small-signal tests, e.g., the circuits of many of the battery testers discussed in the Background of the invention. The battery test circuit 35 preferably, but not necessarily, connects to the battery via a battery test cable 41 having battery clamps 42 (FIG. 4) forming a four-wire Kelvin connection with the battery.

In this preferred, digital embodiment, the user selects vehicle identification parameters (make and model or make, model, and year) using the user input 15. Preferably, the user scrolls through a list of vehicle makes (i.e. list of vehicle manufacturers) using the user input 15, e.g., scrolling down through a list displayed on display 30 by repeatedly actuating a "down" button 47, as illustrated in FIG. 4. Once the desired make is highlighted, the user selects the desired model of the vehicle with the user input 15, e.g., by actuating an "enter" key 45. Similarly, the user scrolls through a list of vehicle models using the user input 15, e.g., scrolling down through a list displayed on display 30 by repeatedly actuating a "down" button 47. The user selects the proper model of the vehicle, e.g., by actuating an "enter" key 45. The user does the same to select a vehicle year, if necessary (some vehicles with the same make and model might require different sized batteries in different years), and other vehicle parameters (e.g., engine size, number of cylinders, or engine VIN) to determine the required battery rating. Once the make and model (and year, if necessary) have been selected, the processor 20 determines the proper battery rating, e.g., CCA rating, from the lookup table 25. The CCA rating is preferably displayed on the alphanumeric display 30. Additionally, the user is preferably prompted to input battery temperature information, e.g., prompted to input whether the temperature of the battery is above 32° F. or below 32° F.

In the preferred, digital embodiment, the determined battery rating (e.g., determined battery CCA) value is automatically used by the code causing the tester to test the battery, instead of requiring the user to manually enter or otherwise input the battery rating into the tester. Of course, in the case of an alternative analog embodiment, i.e. an analog battery tester shown in FIG. 2 having a manual CCA selector, the CCA rating is displayed in the alphanumeric display 70, and the user sets the proper CCA rating using the CCA selector 85.

Figure 2:
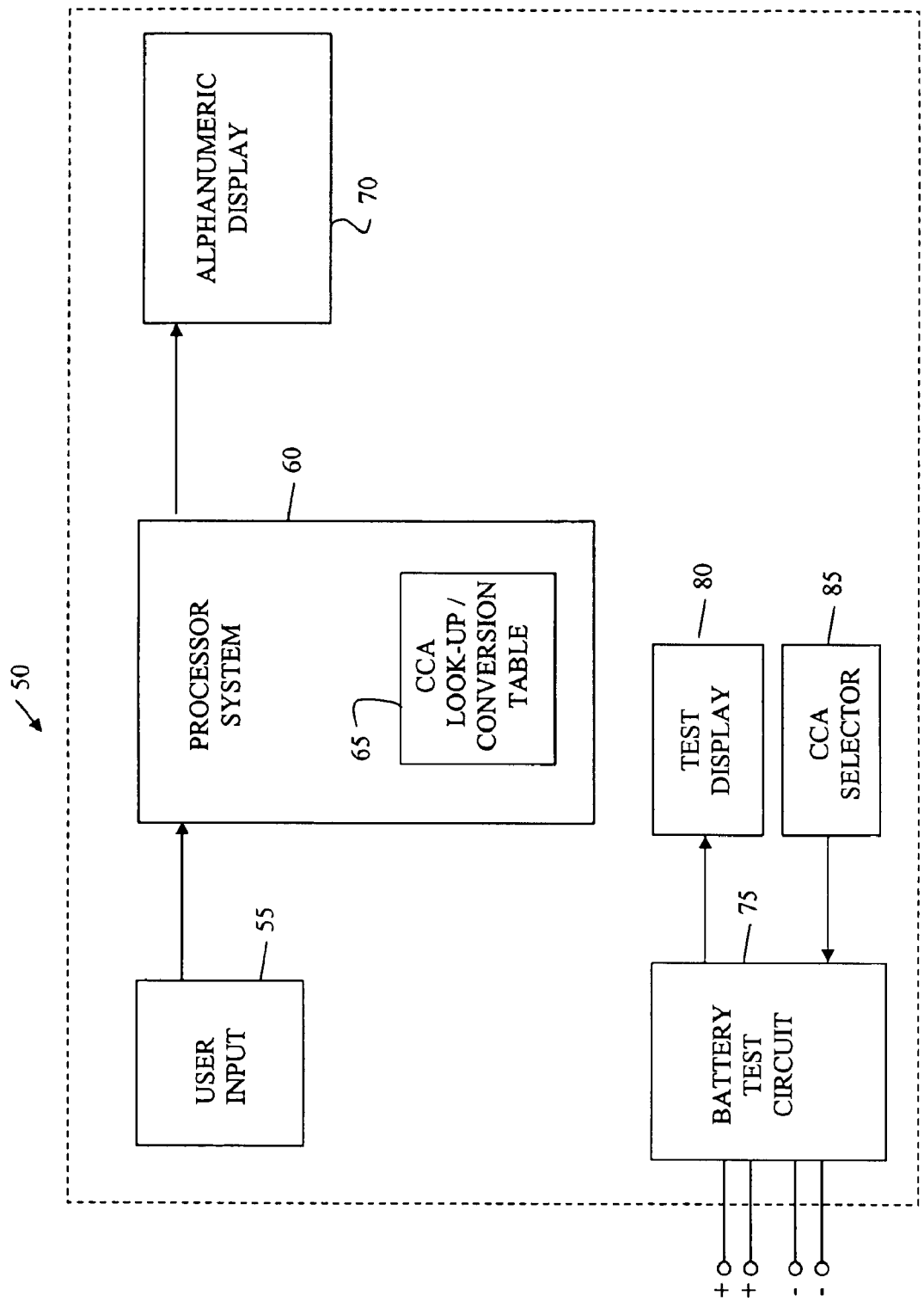
FIG. 2 is a high-level block diagram of an analog battery tester having a battery rating lookup table circuit according to the present invention.

FIG. 2 is a high-level block diagram of an alternative embodiment, i.e., an analog battery tester 50. The analog battery tester 50 preferably includes a user input 55 and an alphanumeric display 70, in circuit communication with a processor system 60. The processor system preferably includes a battery rating (e.g., battery CCA) lookup table 65. The user input 55, processor 60, battery rating lookup table 65, and display 70 are essentially the same as discussed above, except with respect to processor control of the battery test. In the analog battery tester of FIG. 2, the circuit that performs the battery test is preferably an analog battery test circuit in circuit communication with a separate test display 80, and a battery rating selector 85. Although they do not have the additional user input 55, processor 60, battery rating lookup table 65, and display 70 of the present invention, Namaky U.S. Pat. No. 6,384,608 B1, and Cervas U.S. Pat. No. 6,388,488 disclose this type of battery tester having an analog test circuit 75, a test display 80, and a battery rating selector 85. The battery test circuit 75 preferably but not necessarily connects to the battery via a battery test cable having battery clamps forming a four-wire Kelvin connection with the battery. As discussed above in the context of the digital embodiment of FIG. 1, in using the tester 50 of FIG. 2, the user identifies the make and model (and year, if necessary) of the vehicle using the user input 55, the processor 60 determines the battery rating from the lookup table 65, and the determined battery rating is displayed by the processor 60 on the alphanumeric display 70. The user then manually sets the battery rating selector 85 to correspond to the displayed value. In response, the battery test circuit 75 tests the battery using the selected battery rating (e.g., CCA) (in the alternative, the battery test circuit might have been testing the battery the entire time with whatever battery rating had been selected) and the results of the battery test are displayed on the test display 80, e.g., one or more LEDs.

In addition, it is also preferable for the battery rating lookup table 25, 65 to function as a battery standard conversion table. That is, it is also desirable to include in the battery rating lookup table 25, 65 information that the processor 20, 60 can use to convert battery ratings from one standard (e.g., CCA, CA, JIS, DIN, IEC, SAE, EN, etc.) to another, which would permit the battery tester 10 to function as an electronic battery unit standard converter. Therefore, the user can enter a battery rating in one standard (e.g., CCA, CA, JIS, DIN, IEC, SAE, EN, etc.) and have the tester convert that entered battery rating to an equivalent rating in one or more of the different standards. Thus, the tester 10 could be used to convert from one standard to another. In the alternative, one of the displayed equivalent ratings could be automatically entered or manually entered into the tester prior to performing the battery test.

Figure 3:
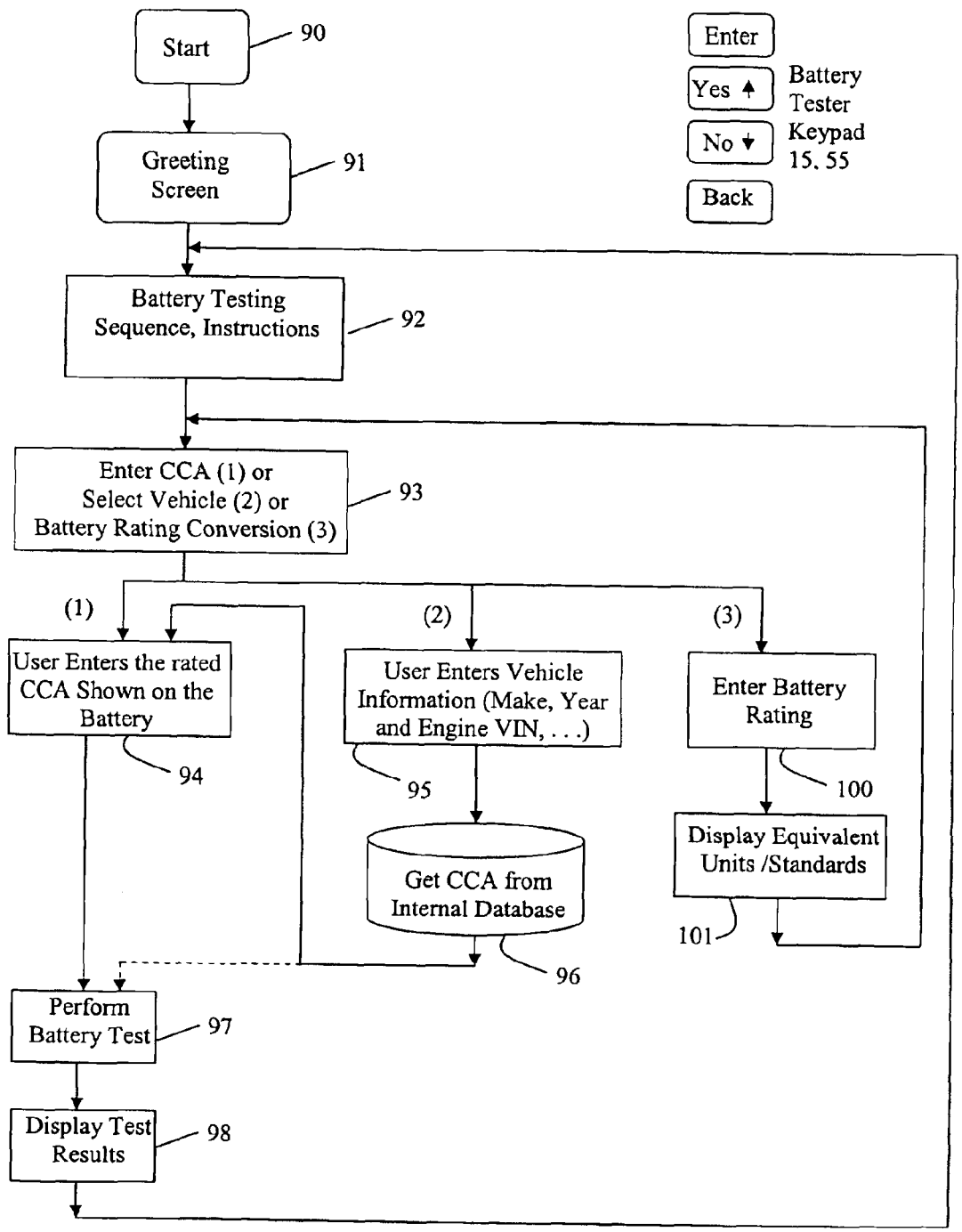
FIG. 3 is a high-level flow chart showing the operation of a battery tester with a battery rating lookup table of the present invention.

FIG. 3 is a high-level flow chart for a battery tester with a CCA lookup table. The flow chart begins at start task 90. At task 91, the processor 20, 60 displays a greeting screen with display 30, 70. Following the display of the greeting, the processor 20, 60 preferably begins displaying battery test instructions to the user via display 30, 70. In response to a prompt, the user is instructed to indicate whether the user desires (1) to enter the battery rating or (2) to have the processor 20, 60 determine the battery rating from the lookup table 25, 65 using a vehicle identification set, or (3) to have the processor convert a battery rating from one standard to one or more different standards, at task 93. If the user selects to enter a vehicle identification set, the user is prompted to select (i.e., input) various vehicle identification parameters (e.g., make and model, or make, model and year, or make, model, year, and number of cylinders, or make, model, year, and engine VIN, etc.) at task 95 using the user input 15, 55. At task 96, the processor 20, 60 determines from the vehicle identification set the battery rating, e.g., CCA rating, from the lookup table 25, 65, which is preferably displayed on display 30, 70. If the user selects to enter a battery rating in one standard to be converted to another standard, the user at 100 is prompted to select (i.e., input) the battery rating and the corresponding standard using the user input 15, 55. At task 101, the processor 20, 60 converts the battery rating to one or more different standards, using the conversion data in the lookup table 25, 65, which converted value(s) is/are preferably displayed on display 30, 70.

Up to this point in the process, the embodiments of FIGS. 1 and 2 are essentially the same. At this point in the process, the two embodiments diverge. The digital embodiment of FIG. 1 will be discussed first. The battery rating determined using the vehicle identification set is preferably automatically used by the processor 20 in the battery test step, at 97. In the alternative, and if the battery rating is not available in the lookup table 25, and/or if the user selects to directly enter the battery rating at task 93, and/or if the user selects to use the tester 10 to convert a battery rating from one standard to another standard at task 93, the process proceeds to task 94 in which the processor 20 prompts the user to manually enter the battery rating using the user input 15. In any event, at task 97, the processor causes the battery test circuit 35 to perform the battery test (or the processor 20, in conjunction with the battery test circuit 35, performs the battery test). Finally, the processor 20 causes the results of the battery test to be displayed on display 30, at task 98, and the code branches up to begin the sequence again, at 92. Typical displayed results can be qualitative conditions, e.g. good, bad, recharge, etc., a quantitative condition displaying measured values, or any other conventional battery test results.

The analog embodiment of FIG. 2 is different. The processor 60 prompts the user to manually enter the battery rating via the battery rating selector 85. In response, the user manually enters the battery rating determined using the vehicle identification set (or the converted battery rating determined by the processor 60 converting a battery rating from one battery standard to another) via the battery rating selector 85, which permits the battery test circuit 75 to test the battery and display the results on test display 80.

Similarly, if the battery rating is not available in the lookup table 25, 65, the processor 60 prompts the user to enter the battery rating. In either event, the battery test circuit performs the battery test and displays the results on the test display 80.

While the present invention has been illustrated by the description of embodiments thereof, and while the embodiments have been described in some detail, it is not the intention of the applicant to restrict or in any way limit the scope of the appended claims to such detail. Additional advantages and modifications will readily appear to those skilled in the art. For example, other parameters indicative of the requied battery rating for a vehicle can be included in the look-up table that are relevant to determining the required battery rating for a vehicle, for example whether the car has air conditioning, auxiliary fan units etc., all of which require additional electric power. Therefore, the invention in its broader aspects is not limited to the specific details, representative apparatus and methods, and illustrative examples shown and described. Accordingly, departures may be made from such details without departing from the spirit or scope of the applicant's general inventive concept.

What is claimed is:

1. A handheld electronic device for determining the required battery rating for a vehicle comprising:
   a housing, at least partially retaining
      a processor in circuit communications with,
         an input device for entering at least one vehicle parameter,
         memory for storing a plurality of battery ratings, and
         an output for displaying a required battery rating for the vehicle,
   wherein executable code instructs the processor to identify the required battery rating based on the at least one vehicle parameter and communicate the identified required battery rating to the output.

2. The handheld electronic device of claim 1 further comprising battery test circuitry for testing of a battery based upon the required battery rating for the vehicle wherein the output is capable of displaying a condition of the battery.

3. The handheld electronic device of claim 2 wherein the condition of the battery is displayed as a qualitative condition.

4. The handheld electronic device of claim 2 wherein the condition of the battery is displayed as a quantitative condition.

5. The handheld electronic device of claim 1 wherein the input device comprises an alphanumeric keypad.

6. The handheld electronic device of claim 1 wherein the input device comprises a scroll key for scrolling through a list of vehicle parameters.

7. The handheld electronic device of claim 1 wherein the at least one vehicle parameter comprises the make and model of the vehicle.

8. The handheld electronic device of claim 7 wherein the at least one vehicle parameter further comprises the year of the vehicle.

9. The handheld electronic device of claim 1 wherein the at least one vehicle parameter comprises the vehicle identification number.

10. The handheld electronic device of claim 1 wherein the at least one vehicle parameter comprises the engine size.

11. The handheld electronic device of claim 1 wherein the required battery rating is the required cold cranking amp (CCA) rating for the vehicle.

12. The handheld electronic device of claim 1 wherein the required battery rating is selected from one of a DIN, IEC, JIS, SAE and EN battery standard.

13. A battery testing device comprising:
   a processor in circuit communication with
      an input device for inputing at least one vehicle parameter,
      memory for storing a lookup table having a plurality of required battery ratings corresponding to a plurality of vehicle parameters,
      an output device capable of displaying a required battery rating for a vehicle based on the at least one vehicle parameter,
   battery test circuitry for testing a battery based upon the required battery rating for the vehicle, the output device capable of displaying the results of the test, and
   a cable configured to selectively place the battery test circuitry in circuit communications with a battery.

14. The battery testing device of claim 13 wherein the output device qualitatively displays the condition of the battery.

15. The battery testing device of claim 13 wherein the output device quantitatively displays the condition of the battery.

16. The battery testing device of claim 13 wherein the required battery rating for the vehicle is manually entered and the battery tester is configured to test the battery based upon the manually entered required battery rating for the vehicle.

17. The battery testing device of claim 13 wherein the cable for placing the battery testing device in circuit communication with the battery comprises a Kelvin type connector.

18. A method of testing a battery comprising:
   inputting at least one vehicle parameter into a battery testing device,
   automatically obtaining a required battery rating for a vehicle based upon the at least one vehicle parameter,
   connecting the battery testing device to a battery,
   testing the battery based upon the required battery rating for the vehicle, and
   displaying a result on the battery testing device.

19. The method of claim 18 wherein the at least one vehicle parameter is selected from a list.

20. The method of claim 18 further comprising displaying the obtained required battery rating on a display.

21. The method of claim 20 further comprising manually entering the obtained required battery rating into the battery testing device via a CCA selector.

22. The method of claim 18 wherein connecting the battery testing device to a battery comprises connecting a Kelvin type connector to the battery.

23. A battery testing device comprising:
   a housing at least partially retaining
      a processor, in circuit communication with
         means for determining a required battery rating of a vehicle,
         battery test circuitry for testing a battery based upon the required battery rating of a vehicle,
         means for connecting the battery test circuitry to a battery, and
         a display for providing feedback indicative at least one of the required battery rating of the vehicle and a battery test result.

24. The device of claim 23 wherein the means for determining the required battery rating of a vehicle comprises entering at least one parameter of the vehicle.

25. The device of claim 23 wherein the means for determining the required battery rating of a vehicle comprises entering a vehicle identification number.

26. The device of claim 23 wherein the means for determining the required battery rating of a vehicle comprises entering a make and model of the vehicle.

27. The device of claim 23 wherein the means for connecting the battery test circuitry to the battery comprises a Kelvin type connector for placing the battery test circuitry in circuit communication with a positive terminal and a negative terminal of the battery.

28. The handheld electronic device of claim 1 further comprising battery test circuitry for automatically testing of a battery based upon the required battery rating for the vehicle wherein the output is capable of displaying a condition of the battery.

29. A handheld electronic device for determining the required battery rating for a vehicle comprising:
   a housing, at least partially retaining
      a processor in circuit communications with,
         an input device for entering a vehicle parameter including a make and model of the vehicle,
         memory for storing a plurality of battery ratings,
         an output for displaying a required battery rating for the vehicle as a function of the vehicle parameter,
         battery test circuitry for testing of a battery based upon the required battery rating for the vehicle
   wherein executable code instructs the processor to identify the required battery rating based on the at least one vehicle parameter and communicate the identified required battery rating to the output.

30. The handheld electronic device of claim 29 wherein the vehicle parameter further comprises the year of the vehicle.

31. The handheld electronic device of claim 29 wherein the battery test circuitry automatically tests a battery based upon the required battery rating for the vehicle.

32. The handheld electronic device of claim 29 wherein the input device allows the user to cause the battery test circuitry to test a battery based upon the required battery rating for the vehicle.

* * * * *